United States Patent
Zinn

(10) Patent No.: US 9,281,275 B2
(45) Date of Patent: Mar. 8, 2016

(54) BOND PAD HAVING RUTHENIUM DIRECTLY ON PASSIVATION SIDEWALL

(71) Applicant: Texas Instruments Incorporated, Dallas, TX (US)

(72) Inventor: Brian Zinn, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 12 days.

(21) Appl. No.: 14/278,613

(22) Filed: May 15, 2014

(65) Prior Publication Data

US 2015/0333010 A1 Nov. 19, 2015

(51) Int. Cl.
| | |
|---|---|
| *H01L 21/311* | (2006.01) |
| *H01L 23/532* | (2006.01) |
| *H01L 23/00* | (2006.01) |
| *H01L 21/768* | (2006.01) |

(52) U.S. Cl.
CPC .... *H01L 23/53238* (2013.01); *H01L 21/76847* (2013.01); *H01L 24/03* (2013.01); *H01L 24/06* (2013.01)

(58) Field of Classification Search
CPC ............ H01L 21/3212; H01L 21/0214; H01L 21/76235; H01L 21/02614; H01L 21/182; H01L 21/28088; H01L 21/28079; H01L 21/3226; H01L 21/7607; H01L 21/76805; H01L 23/4952; H01L 23/49513; H01L 23/5221; H01L 23/53257; H01L 24/04; H01L 24/05; H01L 24/09; H01L 24/76; H01L 24/85; H01L 23/53233; H01L 23/5321; H01L 51/0086; H01L 51/0079; H01L 51/0083

USPC ......... 438/686, 692, 700, 683, 685, 687, 688, 438/672, 612, 617, 618, 769, 756, 757, 743, 438/744, 740; 257/201, 396, 265, 412, 257/E21.006, E21.077, E21.078, E21.079, 257/E21.085, E21.126, E21.127, E21.23, 257/E21.267, E21.278, E21.293, E21.304, 257/E21.324, E21.499, E21.546
See application file for complete search history.

(56) References Cited

U.S. PATENT DOCUMENTS

| | | | |
|---|---|---|---|
| 6,586,839 B2 | 7/2003 | Chisholm et al. | |
| 6,664,175 B2 * | 12/2003 | Jiang et al. ..................... | 438/612 |
| 6,734,086 B2 * | 5/2004 | Suzuki .......................... | 438/575 |
| 7,078,796 B2 | 7/2006 | Dunn et al. | |
| 8,008,202 B2 | 8/2011 | White et al. | |
| 8,148,822 B2 * | 4/2012 | Lin et al. ....................... | 257/763 |
| 8,227,839 B2 * | 7/2012 | West .............................. | 257/276 |

\* cited by examiner

*Primary Examiner* — David Nhu
(74) *Attorney, Agent, or Firm* — Tuenlap D. Chan; Frank D. Cimino

(57) ABSTRACT

A method of forming bond pads includes providing a substrate including an integrated circuit (IC) device formed thereon having an oxidizable uppermost metal interconnect layer which provides a plurality of bond pads that are coupled to circuit nodes on the IC device. The plurality of bond pads include a metal bond pad area. At least one passivation layer provides a trench including dielectric sidewalls above the metal bond pad area. A ruthenium (Ru) layer is deposited directly on the dielectric sidewalls and directly on the metal bond pad area, which removes the need for a barrier layer lining the dielectric sidewalls of the trench. The Ru layer is patterned to provide a bond pad surface for the plurality of bond pads.

16 Claims, 2 Drawing Sheets

BOND PAD HAVING RUTHENIUM DIRECTLY ON PASSIVATION SIDEWALL

FIELD

Disclosed embodiments relate to bond pads for integrated circuits.

BACKGROUND

Integrated circuits (IC) devices are usually fabricated on a semiconductor wafer which has a plurality of IC device die each including a plurality of bond pads on its top surface that connect to various nodes in the device, such as for signal input, signal output and power supply nodes. The bond pads are generally connected by a bond wire or other electrically conductive structure to permit utilization of the IC die. Known methods for connecting an IC device to a lead frame or other support include wire bonding, Tape Automated Bonding (TAB), Controlled Collapse Chip Connection (C4) or bump bonding, and the use of electrically conductive adhesives.

To provide a reliable and low resistance attachment to the bond pad surface, such as by bond wires, some packaging technologies have used multi-layered bond pads having a top metal layer that is both electrically conductive and resistant to oxidation to provide high reliability (good corrosion performance) and high performance (low resistance), such as for wire bonding to the bond pads. One such bond pad arrangement deposits a dielectric passivation layer(s) over an oxidizable uppermost metal interconnect layer such as copper or aluminum, and then forms a trench including dielectric sidewalls from the passivation layer. A barrier layer comprising a refractory metal (e.g., Ta, TaN or Ti) is then deposited that lines the passivation sidewalls which provides good adhesion to the passivation material. A multi-layer metal stack is formed on the barrier layer which can comprise palladium (Pd) as the final (top) layer on a nickel layer over the uppermost metal interconnect layer to provide a stable surface for wire bonding. Pd being a platinum group metal has a low propensity for oxidation and is a good outer capping layer for the bond pad to prevent chemical attack of the oxidizable uppermost metal interconnect layer material thereunder.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize although known multi-layer bond pad stacks for integrated circuits (IC) devices including palladium (Pd) on nickel (Ni) on an oxidizable uppermost metal interconnect layer material such as copper or aluminum generally provide high reliability (low corrosion susceptibility leading to good corrosion performance) and high performance (low resistance), Pd deposition and layer definition is generally an expensive process. Moreover, a barrier layer generally comprising a refractory metal is needed to line the sidewalls of the passivation trench to provide good adhesion for the Ni layer which does not directly adhere well to the passivation material(s).

Disclosed embodiments recognize ruthenium (Ru) provides strong adhesion to conventional passivation dielectrics such as silicon oxide and/or silicon nitride, which enables bond pads for IC devices having Ru as the metal to be in direct contact with the passivation sidewalls of the trench and the bond pad areas of the uppermost metal interconnect layer. This disclosed arrangement eliminates the need for a conventional refractory metal comprising barrier layer lining the passivation sidewalls of the bond pads. Moreover, Ru is recognized to have an electrically conductive oxide which reduces contact resistance to the Ru layer as compared to Pd when surface oxidized to PdO which has significantly less electrical conductivity.

Replacing Pd with Ru on the bond pads is recognized to provide other advantages too. Disclosed embodiments recognize Pd can getter organics in the surrounding ambient so that airborne organics can attach thereon, which can result in adhesion problems to Pd, such as between bond wires and the top surface of the Pd layer. Pd Chemical Mechanical Polishing/Planarizing (CMP) can also generally be difficult to achieve since Pd has a low corrosion susceptibility as compared to Ru, generally requiring a custom-made CMP polishing slurry with the limitation of relatively low Pd polishing rate as compared to more standard metal CMP processes, such as copper CMP.

Ru is also recognized to have a hardness 7 times (~700%) higher than Pd rendering it less susceptible to cracking, and such as during the bond wire attachment process. Moreover, Ru has about a 40% lower bulk electrical resistance as compared to Pd translating into improved electrical signal transmission and improved matching with copper or gold bond wires which are commonly used wire materials for connection to bond pads.

BRIEF DESCRIPTION OF THE DRAWINGS

Reference will now be made to the accompanying drawings, which are not necessarily drawn to scale, wherein.

DETAILED DESCRIPTION

Figure 1:
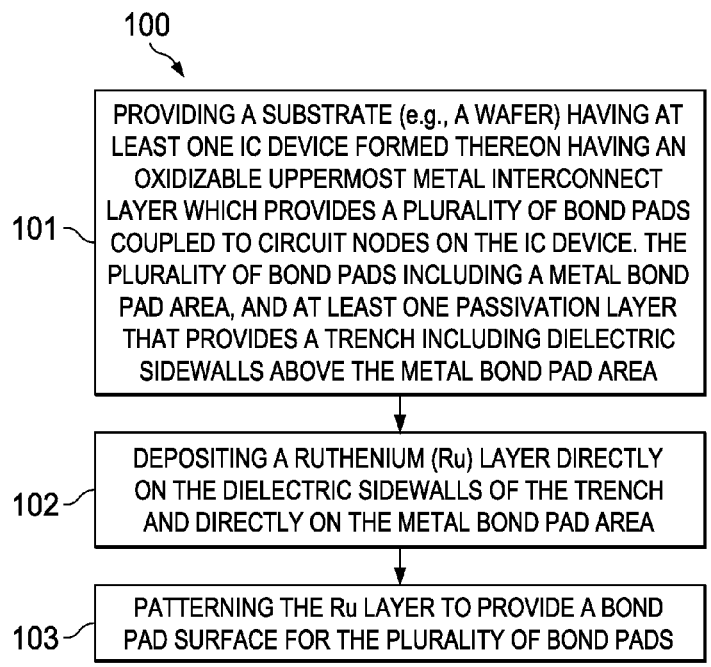
FIG. 1 is a flow chart that shows steps in an example method for forming bond pads having a metal bond pad area of oxidizable uppermost metal interconnect layer of an IC device including a Ru layer directly on the dielectric sidewalls of a passivation trench over the metal bond pad area, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming bond pads having a Ru layer directly on the dielectric sidewalls of a trench over the metal bond pad area for an IC device, according to an example embodiment. Step 101 comprise providing a substrate (e.g., a wafer) having least one IC device die formed thereon having an oxidizable uppermost metal interconnect layer which provides a plurality of bond pads coupled to circuit nodes on the IC device. The plurality of bond pads includes a metal bond pad area, and at least one passivation layer thereon that provides a trench including dielectric sidewalls above the metal bond pad area.

The substrate can comprise silicon, silicon-germanium, or other semiconductor materials including III-V or II-VI materials. The uppermost metal interconnect layer can comprise copper or aluminum, or alloys thereof.

Step 102 comprises depositing a Ru layer directly on the dielectric sidewalls of the trench and directly on the metal bond pad area. As used herein, the Ru layer being "directly on the metal bond pad area" includes the conventional contact arrangement where the uppermost metal interconnect layer has a native oxide layer formed at room temperature that is about 2 nm thick, such as primarily $Cu_2O$ in the case of copper. The direct Ru attachment removes the need for a barrier layer lining the dielectric sidewalls of the trench. The Ru layer can be sputter deposited using a Ru sputtering target for sputter coating on the substrate (e.g., wafer) surface. the Ru sputter can be performed at a relatively low temperature, such as 25° C. to 300° C. Due to the about 10× lower cost of Ru as compared to Pd, Ru targets are about 35% to 55% lower cost for when compared to Pd targets. The Ru layer may be a Ru alloy, such as including Zr or another transition metal from 1 ppm up to 10 wt. %, such as 0.5 wt. % to 5 wt. %. The thickness of the Ru layer is generally 0.05 μm to 2 μm, such as from 0.2 μm to 2 μm.

Step 103 comprises patterning the Ru layer to provide a bond pad surface for the plurality of bond pads for bonding to the plurality of bond pads. CMP can be used to remove overburden Ru above the top of the passivation layer(s) while preserving the Ru within the bond pad. For example, an aqueous slurry for polishing Ru can comprise about 0.5 wt. % to about 12 wt. % abrasive particles, such as comprising alumina, silica, cerium oxide or titania, at least one oxidizer in a concentration from 0.05 M to 1 M such as hydrogen peroxide, and a pH range from about 1 to 8.5.

Figure 2:
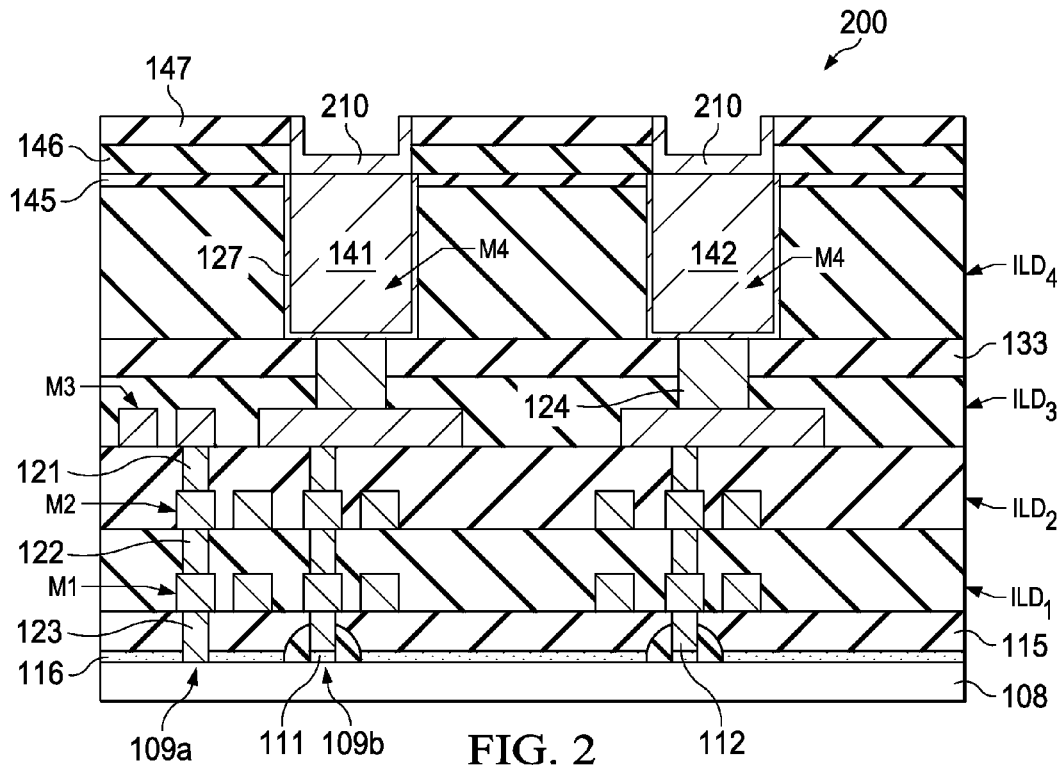
FIG. 2 is a cross sectional view of an example integrated circuit (IC) device including example bond pads having a Ru layer directly on the dielectric sidewalls of a passivation trench over the metal bond pad areas, according to an example embodiment.

FIG. 2 is a cross sectional view of an IC device 200 including example bond pads having a Ru layer 210 directly on the directly on the dielectric sidewalls of the trench and directly on the metal bond pad areas of the oxidizable uppermost metal interconnect layer, according to an example embodiment. The metal stack is shown including three (3) layers of metal interconnect shown as M1, M2 and M3 damascened into ILD1, ILD2, and ILD3, respectively, on a dielectric layer over the top semiconductor surface that may be referred to as a pre-metal dielectric (PMD) 115 that is on another dielectric layer 116, such as a thermally grown silicon oxide layer. An uppermost fourth metal interconnect layer shown as M4 provides a plurality of bond pad metal areas shown as metal bond pad area 141 and metal bond pad area 142. A dielectric layer shown as 133 is on ILD3 that provides an etch stop, such as comprising silicon nitride.

Plugs 121 are shown coupling M3 to M2, plugs 122 coupling M2 to M1, and plugs 123 coupling M1 to node 109a shown as a diffusion (e.g., n+ or p+) and to 109b shown as a gate electrode node (circuitry not shown, with 109b being a contact to a metal oxide semiconductor (MOS) gate 112 on a gate dielectric 111 on the semiconductor surface of a substrate 108, such as a silicon comprising surface in one embodiment. The plugs 121, 122, 123 and 124 can all comprise tungsten, or other suitable electrically conductive plug material.

M4 comprises an oxidizable metal material such as copper shown damascened into ILD4 framed/lined by a refractory metal comprising barrier layer 127. For example, the barrier layer 127 can comprise Ta, TaN, Ti or TiN. M4 can also comprise aluminum. Metal bond pad areas 141 and 142 are shown coupled by plug 124 though dielectric layer 133 and ILD3 to M3, and from M3 all the way to features on the semiconductor surface, such as from metal bond pad area 141 to node 109b.

IC device 200 includes at least one passivation layer(s) which defines a trench over the metal bond pad areas 141 and 142, with the passivation shown in FIG. 2 being a first dielectric layer 147 (e.g., silicon nitride or silicon oxynitride) on a second dielectric layer 146 (e.g., silicon oxide or silicon oxynitride) on an etch stop layer 145 (e.g., silicon nitride). A Ru layer 210 directly contacts the dielectric sidewalls of the trench and is directly connected to the top surface of the metal bond pad areas 141 and 142, so that there is no conventional intervening barrier layer, typically being a refractive metal comprising barrier layer. As noted above disclosed embodiments recognize Ru provides strong adhesion to dielectric layers such as silicon oxide and silicon nitride, which enables direct connection of the Ru layer and thus elimination of conventional barrier layer processing needed for proper adhesion to dielectric layers such as silicon oxide and silicon nitride, such as needed by conventional metals including Ni. Optionally, a layer of an electrically conductive material may be positioned on the Ru layer.

IC devices having disclosed bond pads including a layer of Ru directly on the dielectric sidewalls of the trench and directly on the metal bond pad area of the uppermost metal interconnect layer will generally achieve the similar or better performance and reliability as known Pd on Ni. Like Pd, Ru is recognized to be a platinum group metal with low oxidation potential. Ru has about a 40% lower bulk resistivity compared to Pd. Utilizing a Ru layer in place of a Pd layer on Ni layer on a barrier layer reduces back end of the line (BEOL) processing cost and cycle time. Moreover, as noted above, Ru is expected to provide better bond adhesion as compared to Pd due to a reduced tendency to getter organics from the surrounding ambient, resulting in an improvement in bond strength and a resulting reliability improvement.

Figure 3:
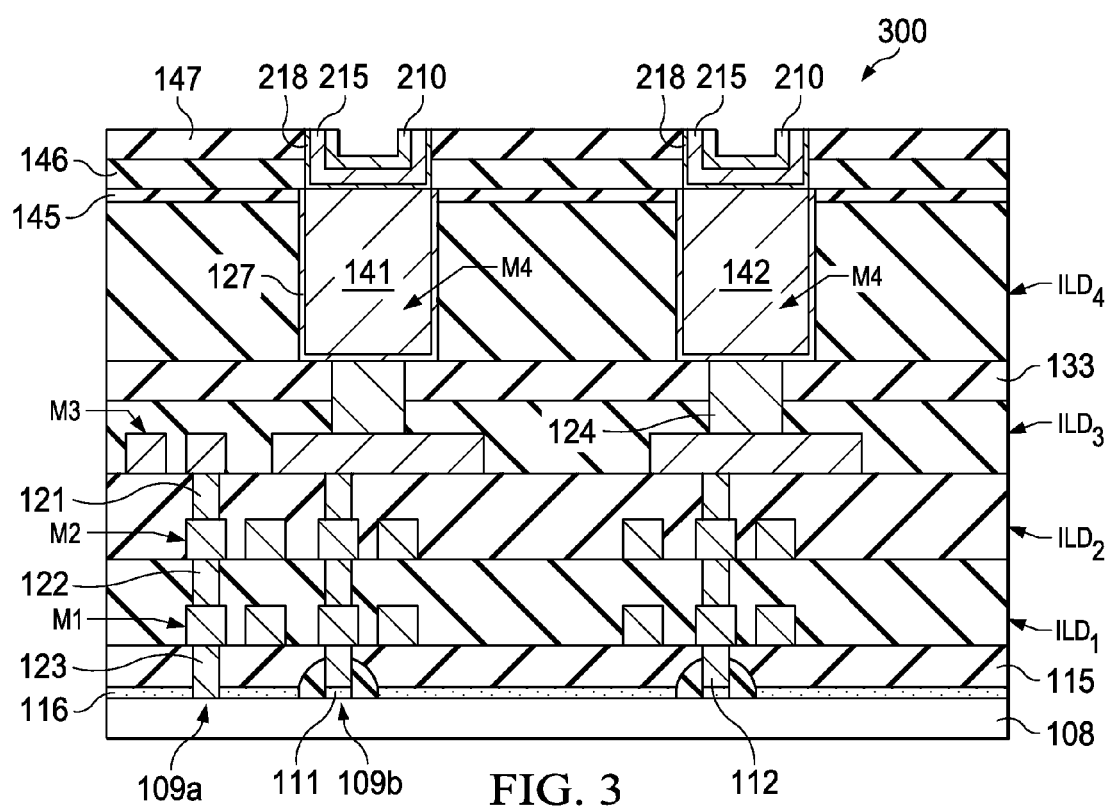
FIG. 3 is a cross sectional view of an example IC device including example bond pads having a Ru layer on a Ni layer on a refractory metal comprising barrier layer on the dielectric sidewalls of a passivation trench over the metal bond pad areas, according to an example embodiment.

FIG. 3 is a cross sectional view of an example IC device 300 including example bond pads having a Ru layer 210 on a Ni layer 215 on a refractory metal comprising barrier layer 218 on the dielectric sidewalls of a passivation trench over the metal bond pad areas, according to an example embodiment. A trench is over the metal bond pad areas 141 and 142, with the passivation shown in FIG. 3 being the same as in FIG. 2 comprising a first dielectric layer 147 (e.g., silicon nitride or silicon oxynitride) on a second dielectric layer 146. The barrier layer 218 can comprise Ta, TaN, Ti or TiN, and can be 45 nm to 180 nm thick. The Ni layer 215 can be from 0.1 μm to 1 μm thick, and the Ru layer can be 0.05 μm to 2 μm thick.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming bond pads, the method comprising:
providing a substrate including at least one integrated circuit (IC) device formed thereon having an oxidizable uppermost metal interconnect layer which provides a plurality of bond pads coupled to circuit nodes on said IC device, said plurality of bond pads including a metal bond pad area, and at least one passivation layer that provides a trench including dielectric sidewalls above said metal bond pad area;
depositing a ruthenium (Ru) layer directly on said dielectric sidewalls and directly on said metal bond pad area, and
patterning said Ru layer to provide a bond pad surface for said plurality of bond pads.

2. The method of claim 1, wherein said depositing comprises sputtering.

3. The method of claim 1, wherein said pattering comprises chemical mechanical polishing (CMP).

4. The method of claim 1, wherein said oxidizable uppermost metal interconnect layer comprises copper.

5. The method of claim 1, wherein said oxidizable uppermost metal interconnect layer comprises aluminum.

6. The method of claim 1, wherein said Ru layer further comprises at least one transition metal in a concentration from 1 ppm to 10 wt. %.

7. The method of claim 4, wherein said Ru layer is a topmost layer on said plurality of bond pads.

8. The method of claim 1, wherein said substrate comprises silicon.

9. The method of claim 1, wherein said Ru layer is from 0.05 μm to 2 μm thick.

10. A method of forming bond pads, the method comprising:
providing a substrate comprising silicon including at least one integrated circuit (IC) device formed thereon having an oxidizable uppermost metal interconnect layer comprising copper which provides a plurality of bond pads coupled to circuit nodes on said IC device, said plurality of bond pads including a copper bond pad area, and at least one passivation layer that provides a trench including dielectric sidewalls above said copper bond pad area;
depositing a ruthenium (Ru) layer directly on said dielectric sidewalls and directly on said copper bond pad area, and
patterning said Ru layer to provide a bond pad surface for said plurality of bond pads.

11. An integrated circuit (IC), comprising:
a substrate including at least one IC device formed thereon;
a plurality of metal interconnect layers including an oxidizable uppermost metal interconnect layer which provides a plurality of bond pads coupled to circuit nodes on said IC device, said plurality of bond pads including a metal bond pad area,
at least one passivation layer including dielectric sidewalls defining a trench above said metal bond pad area;
a ruthenium (Ru) layer directly on said dielectric sidewalls and directly on said metal bond pad area, wherein said Ru layer provides a bond pad surface for said plurality of bond pads, said Ru layer including at least one transition metal in a concentration from 1 ppm to 10 wt. %.

12. The IC of claim 11, wherein said oxidizable uppermost metal interconnect layer comprises copper.

13. The IC of claim 11, wherein said oxidizable uppermost metal interconnect layer comprises aluminum.

14. The IC of claim 11, wherein said Ru layer is a topmost layer on said plurality of bond pads.

15. The IC of claim 11, wherein said substrate comprises silicon.

16. IC of claim 11, wherein said Ru layer is from 0.05 μm to 2 μm thick.

* * * * *